(12) United States Patent
Uratani et al.

(10) Patent No.: US 7,248,095 B2
(45) Date of Patent: Jul. 24, 2007

(54) BUS DRIVER WITH WELL VOLTAGE CONTROL SECTION

(75) Inventors: Munehiro Uratani, Yamatokoriyama (JP); Yuji Kasai, Tsukuba (JP); Tetsuya Higuchi, Tsukuba (JP); Eiichi Takahashi, Tsukuba (JP)

(73) Assignee: Sharp Kabushiki Kaisha, Osaka (JP)

( * ) Notice: Subject to any disclaimer, the term of this patent is extended or adjusted under 35 U.S.C. 154(b) by 1 day.

(21) Appl. No.: 11/213,779

(22) Filed: Aug. 30, 2005

(65) Prior Publication Data

US 2006/0055449 A1 Mar. 16, 2006

(30) Foreign Application Priority Data

Aug. 31, 2004 (JP) .......................... 2004-253577

(51) Int. Cl.
*G05F 1/10* (2006.01)

(52) U.S. Cl. ......................... 327/535; 327/537

(58) Field of Classification Search .................. None
See application file for complete search history.

(56) References Cited

U.S. PATENT DOCUMENTS

| | | | | |
|---|---|---|---|---|
| 5,160,855 A | * | 11/1992 | Dobberpuhl | 327/108 |
| 5,422,591 A | * | 6/1995 | Rastegar et al. | 327/409 |
| 5,543,733 A | * | 8/1996 | Mattos et al. | 326/81 |
| 5,646,550 A | * | 7/1997 | Campbell et al. | 326/81 |
| 5,783,935 A | * | 7/1998 | Kyung | 323/313 |
| 5,825,206 A | * | 10/1998 | Krishnamurthy et al. | 326/81 |
| 5,936,456 A | * | 8/1999 | Naka | 327/437 |
| 5,963,055 A | * | 10/1999 | Tanaka et al. | 326/81 |
| 6,265,926 B1 | * | 7/2001 | Wong | 327/318 |
| 6,313,691 B1 | * | 11/2001 | Podlesny et al. | 327/534 |
| 6,326,832 B1 | * | 12/2001 | Macaluso | 327/534 |
| 6,362,665 B1 | * | 3/2002 | Davis et al. | 327/108 |
| 6,529,421 B1 | * | 3/2003 | Marr et al. | 365/189.09 |
| 6,573,765 B2 | * | 6/2003 | Bales et al. | 327/108 |
| 6,765,430 B2 | * | 7/2004 | Ando | 327/534 |
| 6,970,024 B1 | * | 11/2005 | Reese et al. | 327/112 |
| 2003/0076153 A1 | * | 4/2003 | Shakeri et al. | 327/534 |
| 2004/0119526 A1 | * | 6/2004 | Ajit | 327/536 |
| 2004/0135621 A1 | * | 7/2004 | Sumita et al. | 327/534 |
| 2004/0239408 A1 | * | 12/2004 | Chen et al. | 327/536 |
| 2005/0052219 A1 | * | 3/2005 | Butler et al. | 327/534 |
| 2005/0093611 A1 | * | 5/2005 | Fujita et al. | 327/534 |

OTHER PUBLICATIONS

Inoue et al., 2001 IEEE International Solid-State Circuits Conference 20.2, Feb. 7, 2001, pp. 316-317.

* cited by examiner

*Primary Examiner*—Tuan T. Lam
*Assistant Examiner*—William Hernandez
(74) *Attorney, Agent, or Firm*—Birch, Stewart, Kolasch & Birch, LLP

(57) ABSTRACT

A bus driving device is provided with a driver circuit for driving a bus line thereof. The driver circuit includes an MOS transistor whose well is separated from other circuits. Further, the bus driving device is provided with a voltage control section for adjusting a well voltage, in accordance with a level of a signal in the bus line. With this bus driving device, a threshold voltage of the MOS transistor is set at a predetermined target value.

7 Claims, 15 Drawing Sheets

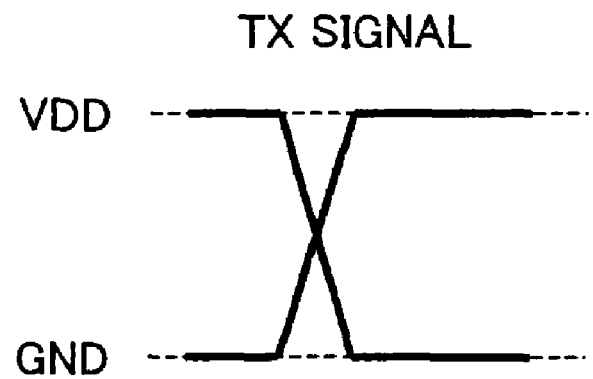
FIG. 11 (a) PRIOR ART
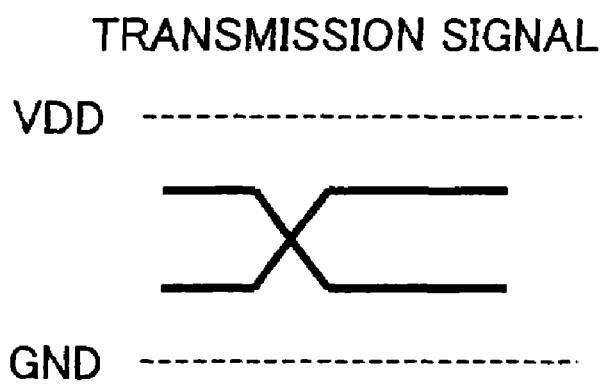
FIG. 11 (b) PRIOR ART
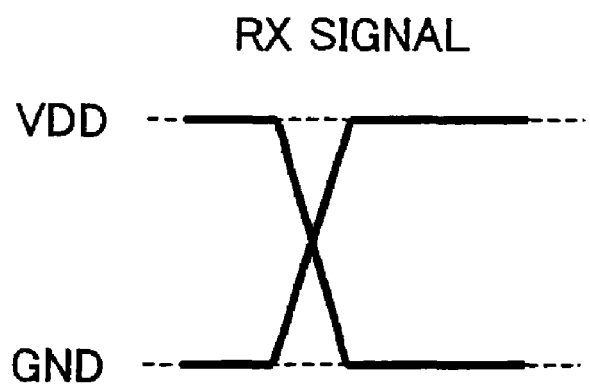
FIG. 11 (c) PRIOR ART FIG. 12 (a)   PRIOR ART
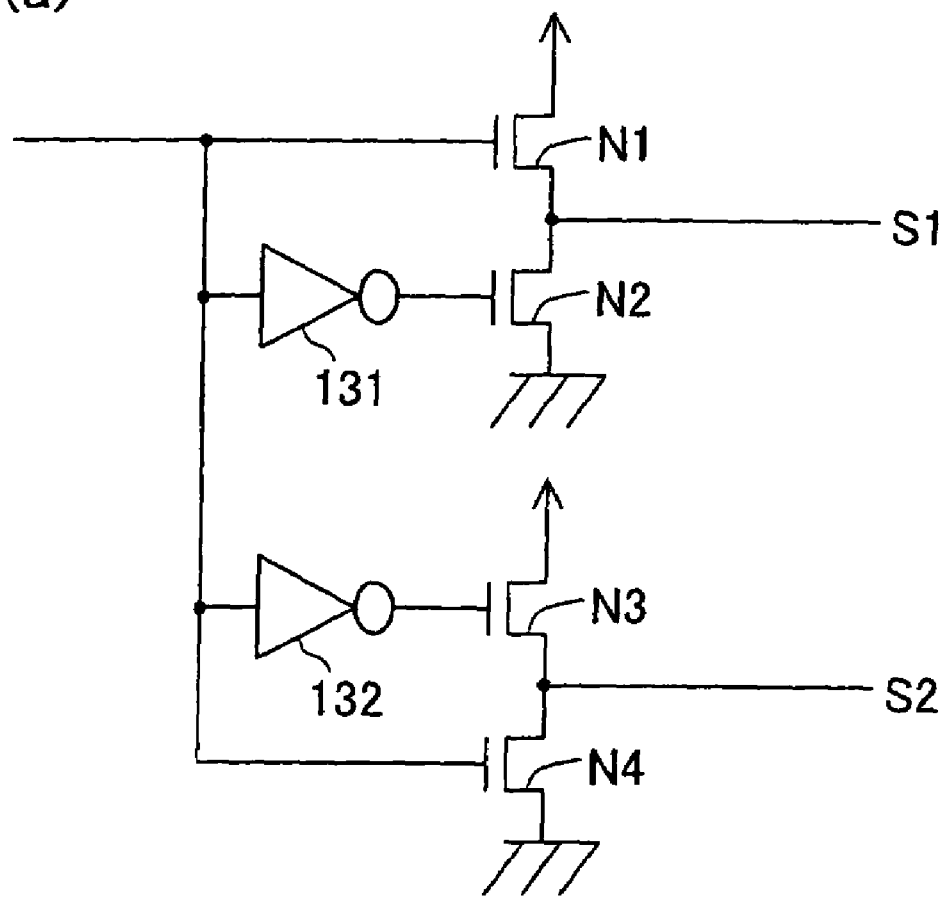
FIG. 12 (b)   PRIOR ART
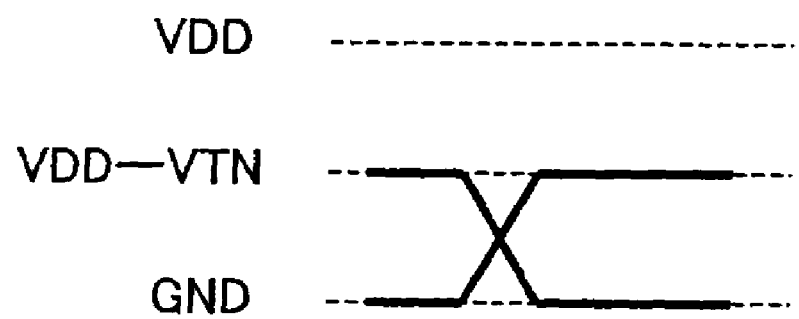

FIG. 13 (a)   PRIOR ART
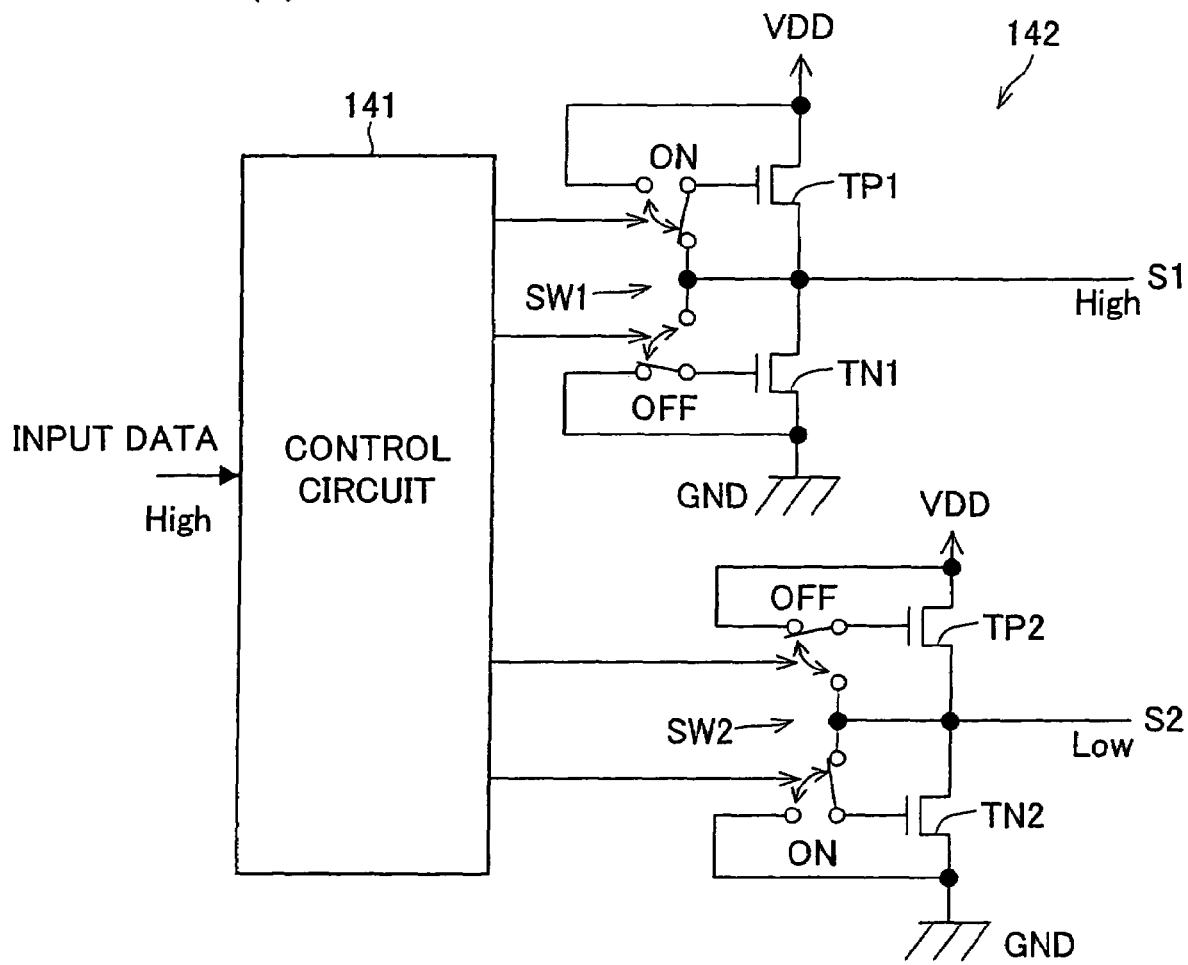
FIG. 13 (b)   PRIOR ART
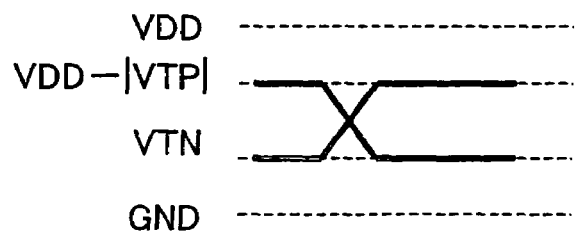

FIG. 14 (a) PRIOR ART
REDUCED-AMPLITUDE DRIVER CIRCUIT
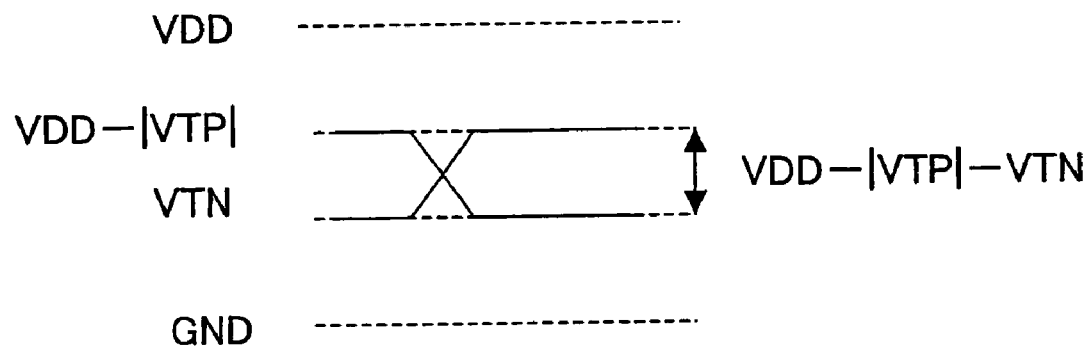
FIG. 14 (b) PRIOR ART
CONVENTIONAL INVERTER DRIVER CIRCUIT
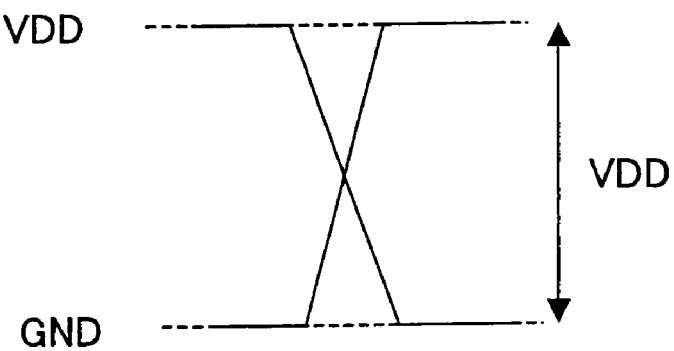

BUS DRIVER WITH WELL VOLTAGE CONTROL SECTION

This Nonprofessional application claims priority under 35 U.S.C. § 119(a) on Patent Application No. 2004/253577 filed in Japan on Aug. 31, 2004, the entire contents of which are hereby incorporated by reference.

FIELD OF THE INVENTION

The present invention relates to a bus driver which is commonly used in digital circuits such as processors, DSP, and ASIC, the bus driver being capable of keeping an amplitude of a signal small, thereby reducing a power consumption of the digital circuit.

BACKGROUND OF THE INVENTION

FIG. 9 illustrates large capacitance signal lines, such as an internal bus line 102 or a clock line 103, in an LSI (Large Scale Integrated circuit) 101.

For example, the LSI 101 is provided therein with a table memory 111, data memories 112 and 113, an instruction memory 114, an ALU (Arithmetic and Logic Unit) 115, a multiplier 116, a sequencer 117, a clock driver 118, and a random logic 119. These sections transmit or receive data, an address, a control signal, or the like via the internal bus line 102 including a data bus, an address bus, a peripheral bus, or the like. Further, to each of these sections, a clock (clock signal) is supplied from the clock driver 118 via the clock line 103.

In order to realize a high performance of the LSI 101, it is essential to (I) realize an ultra high-speed clock transmission in the clock line 103, (II) realize a high-speed signal transmission in the internal bus line 102, and (III) increase a number of lines extending side by side, in the internal bus line 102. However, an increasing power consumption accompanying electric charging/discharging to/from these large capacitance lines has been a significant concern.

In many cases, an inverter circuit is used as a typical driver circuit. This inverter circuit however is a main cause of the increase in an overall power consumption of the LSI 101. This is because the use of the inverter circuit causes a signal level to swing up to a level of a power source voltage.

In view of the foregoing problem, a large number of methods have been suggested in which the power consumption is reduced by reducing the amplitude of the signal in the bus line. However, these methods are hardly used, on the grounds that variations in a process of manufacturing the LSI 101 and changes in an operating environment cause significant changes in properties of the LSI 101 and unstable operation of the LSI 101.

For example, a reduced-amplitude circuit for reducing the power consumption is disclosed in Atsuki Inoue et al., "A Low Power SOI Adder Using Reduced-Swing Charge Recycling Circuits", ISSCC 2001, Feb. 7, 2001. The following describes in detail about a typical reduced-amplitude bus driving method disclosed in the document.

FIG. 10 illustrates a basic configuration of a typical conventional reduced-amplitude bus driving system. Each of FIG. 11(a) through FIG. 11(c) indicates an amplitude of a signal in each section of the small amplitude bus driving system.

In the bus driving system illustrated in FIG. 10, signals are transmitted from a driver-side device 121 to a receiver-side device 122 via a large capacitance bus line 123 having signal lines L1 and L2. As illustrated in FIG. 11(a) and FIG. 11(c), High levels of pre-transmission signals (TX signals) from the driver-side device 121 and received signals (RX signals) received by the receiver-side device 122 are set at a power source voltage VDD, and Low levels of the TX signals and the RX signals are set at a ground potential GND.

Driver circuits 125 and 126 respectively convert (I) a pre-transmission signal and (II) a pre-transmission signal that has been inverted by an inverter 124 into a signal whose High level voltage is lower than the power source voltage VDD, and whose Low level voltage is higher than the ground potential GND. Accordingly, as illustrated in FIG. 11(b), in the bus line 123, the signal levels of the transmission signals are restrained from fully swinging between the power source voltage VDD and the ground potential GND. Since the power consumption is proportional to the amplitude, power consumed in the bus line 123 is reduced by reducing the amplitudes of the transmission signals. Further, the received signals are reconverted by a differential amplifier 127 in the receiver-side device 122, so that signal levels of the received signals fully swing between the power source voltage VDD and the ground potential GND.

FIG. 12(a) illustrates a specific example of the reduced-amplitude bus driving circuit in the reduced-amplitude bus driving system illustrated in FIG. 10, and FIG. 12(b) illustrates an output signal from the reduced-amplitude bus driving circuit. FIG. 13(a) illustrates another specific example of the reduced-amplitude bus driving circuit in the reduced-amplitude bus driving system illustrated in FIG. 10, and FIG. 13(b) illustrates an output signal from the reduced-amplitude bus driving circuit.

The bus driving circuit illustrated in FIG. 12(a) is a Vtn-down type circuit. This bus driving circuit is a driver circuit for generating two output signals S1 and S2 which are complementary with respect to each other. Such bus driving circuit has (I) nMOS transistors N1 and N2 being serially connected, the nMOS transistors N1 and N2 being provided between a power line and a ground line, and (II) nMOS transistors N3 and N4 being serially connected with each other, the nMOS transistors N3 and N4 being provided between a power line and a ground line. Signals are inputted as they are to gates of the nMOS transistors N1 and N4, and signals being inverted by the inverters 131 and 132 are respectively inputted to gates of the nMOS transistors N2 and N3.

As illustrated in FIG. 12(b), in the bus driving circuit, the respective Low level voltages of the output signals S1 and S2 are equal to the ground potential GND. However, when signal levels of the output signals S1 and S2 approach the High level voltages, the transistors turn off at a point where respective gate-source voltages of the nMOS transistors N1 and N3 reach a threshold voltage Vtn of the nMOS transistors N1 and N3. Accordingly, the High level voltages of the output signals S1 and S2 are lower, by the threshold voltage Vtn, than the power source voltage VDD.

The bus driving circuit illustrated in FIG. 13(a) is a diode-type circuit. This bus driving circuit includes a control circuit 141 and a driver circuit 142 being controlled by the control circuit 141. Further, in order to generate two output signals S1 and S2 which are complementary with respect to each other, the driver circuit 142 has: (I) pMOS transistors TP1 and TP2, and nMOS transistors TN1 and TN2, each of which serves as a driver transistor; and (II) switches SW1 and SW2.

The pMOS transistor TP1 and the nMOS transistor TN1 are serially connected with each other, and are provided between a power line and a ground line. Further, the pMOS transistor TP2 and the nMOS transistor TN2 are serially connected with each other, and are provided between a power line and a ground line. Gates of the pMOS transistor TP1 and the nMOS transistor TN1 are connected, via the switches SW1, to VDD/GND or an output line (S1 line) for the output signal S1. Further, gates of the PMOS transistor TP2 and the nMOS transistor TN2 are connected, via the switches SW2, to VDD/GND or an output line (S2 line) for the output signal S2.

The control circuit 141 controls the switches SW1 and SW2 so as to switch-over signal lines in accordance with a signal level of input data, the signal lines respectively being connected with each of the foregoing gates in the driver circuit 142. FIG. 13(a) illustrates a case in which the signal level of the input data is High.

The connections of the driver transistors are controlled as follows, in accordance with the signal levels of the input data.

(1) When the Signal Level of the Input Data is High.

The gate of the pMOS transistor TP1 is connected to the S1 line.

The gate of the nMOS transistor TN1 is connected to GND (Low).

The gate of the pMOS transistor TP2 is connected to VDD (High).

The gate of the nMOS transistor TN2 is connected to the S2 line.

(2) When the Signal Level of the Input Data is Low.

The gate of the pMOS transistor TP1 is connected to VDD (High).

The gate of the nMOS transistor TN1 is connected to the S1 line.

The gate of the pMOS transistor TP2 is connected to the S2 line.

The gate of the nMOS transistor TN2 is connected to GND (Low).

Thus, complementary output signals S1 and S2 are obtained.

When the signal level of the input data inputted to the control circuit 141 changes from the Low level to the High level, the output signal S1 outputted from the driver circuit 142 also changes its signal level from the Low level to the High level. The pMOS transistor TP1 turns off when the source-gate voltage thereof equals the threshold voltage VTP (negative value) of the pMOS transistor TP1. Here, since a source of the pMOS transistor TP1 is fixed at the power source voltage VDD, the gate voltage of the pMOS transistor TP1 is VDD−|VTP|. This voltage is a High level voltage of the output signal S1 (See FIG. 13(b)).

Further, when the input data mentioned above is changed as in the foregoing case, the output signal S2 changes its signal level from the High level to the Low level. Here, the nMOS transistor TN2 turns off when the source-gate voltage thereof equals the threshold voltage Vtn. At this point, since the source of the nMOS transistor TN2 is fixed at the ground potential GND, the gate voltage of the nMOS transistor is the threshold voltage Vtn. This voltage is a Low level voltage of the output signal S2 (See FIG. 13(b)).

When the signal level of the input data is Low, a similar operation causes the voltage of the output signal S1 to become the threshold voltage Vtn which is a Low level voltage of the output signal S1. Meanwhile, the voltage of the output signal S2 becomes VDD−|Vtp| which is a High level voltage of the output signal S2.

FIG. 14(a) illustrates output signals from driver circuits 125 and 126 in the reduced-amplitude bus driving system illustrated in FIG. 10. FIG. 14(b) illustrates output signals from a conventional inverter driving circuit.

Amplitudes of the output signals from the driving circuits 125 and 126 are VDD−|Vtp|−Vtn, as illustrated in FIG. 14(a). In order to ensure a sufficient performance, a minimum amplitude is set at no less than 0.2V, in the driver circuits 125 and 126. On the other hand, as illustrated in FIG. 14(b), the output signals from the conventional inverter driver circuit swings from the ground potential GND to the power source voltage VDD. A power consumption ratio of the driver circuits 125 and 126 with respect to the conventional inverter driver circuit is proportional to the amplitudes, and the ratio is therefore expressed as: (VDD−|Vtp|−Vtn)×2/VDD. Accordingly, the foregoing power consumption ratio becomes 27%, when: VDD=1.5V, |Vtp|=0.65V, and Vtn=0.65V. Thus, it is possible to remarkably reduce power consumption.

However, the reduced-amplitude bus driving system of FIG. 10 is hardly used in LSI's. This is because the Vth is influenced by variations in the production process and temperature changes, as described below.

FIG. 15 illustrates how a signal amplitude and power consumption are influenced by the changes in the threshold voltage Vth in the reduced-amplitude bus driving system of FIG. 10, the changes being caused by variations in the production process and temperature changes. FIG. 15 illustrates a case where the threshold voltage Vth changes by ±0.1V due to variations in the production process, and changes by ±0.1V due to temperature changes within a range of ±40° C. than the normal temperature.

When the minimum amplitude for guaranteeing sufficient performance is 0.2V, it is necessary that: Vtn=|Vtp|=0.65V or less. In this case, the power consumption ratio of the driving circuits 125 and 126 with respect to the conventional inverter driving circuit is 0.27 as described before. This allows the most remarkable power consumption reduction. Further, in consideration of changes in the threshold voltage Vth, a targeted value of the process needs to be: Vtn(center value)=|Vtp| (center value)=0.45V. In this case, the amplitude is 0.6V, and the power consumption ratio is 0.8. However, Vtn=|Vtp|=0.25V, if variations in the production process and temperature changes cause the threshold voltage Vth to be minimized. As such, the amplitudes become 1.0V and the power consumption ratio becomes 1.35. This causes a reverse effect, thereby increasing the power consumption in the reduced-amplitude bus driving system.

As described, with the conventional reduced-amplitude bus driving system, the amplitudes of the output signals are dependent on changes in the threshold voltage Vth; i.e., dependent on variations in the production process and temperature changes. Accordingly, it is difficult to optimize both power consumption and operational margin, which vary according to the changes in threshold voltage Vth.

SUMMARY OF THE INVENTION

It is an object of the present invention to provide a bus driving device which allows stable driving of a bus line by keeping an amplitude of a signal in the bus line stable, while avoiding influences from changes in a threshold voltage caused by variations in a production process or changes in ambient temperature.

In order to achieve the foregoing object, a bus driving device of the present invention includes: (I) a driver circuit for driving a bus line, the driver circuit including an MOS transistor whose well is separated from other circuits; and (II) a voltage control section for adjusting, in accordance with a level of a signal in the bus line, a value of a well voltage, so that a threshold voltage of the MOS transistor is kept at a predetermined target value.

In the configuration, the well of the MOS transistor constituting the driver circuit is separated from the other circuits. As such, it is possible to set the voltage to be applied to the well, independent of the transistors in the other circuits. Further, the level (High level or Low level) of the signal in the bus line is determined by adjusting the well voltage. It is possible to determine the signal levels by adjusting the well voltage. Accordingly, in the bus driving device of the present invention, the voltage control section adjusts the well voltage in accordance with the level of the signal in the bus line. This allows the threshold voltage of the MOS transistor to be set at the target value. Thus, even if the threshold voltage changes due to variations in a production process or due to a change in ambient temperature, so that the level of the signal in the bus line changes, then the threshold voltage of the MOS transistor is controlled to be equal to the target value by adjusting the well voltage.

Additional objects, features, and advantages of the present invention will be made clear by the description below. Further, the advantages of the present invention will be evident from the following explanation in reference to the drawings.

BRIEF DESCRIPTION OF THE DRAWINGS

FIG. 11(a) is a diagram illustrating TX signals (pre-transmission signals) at a driver side device in the reduced-amplitude bus driving system, FIG. 11(b) is a diagram illustrating transmission signals in a bus line in the reduced-amplitude bus driving system, and FIG. 11(c) is a diagram illustrating RX signals (received signals) received by a receiver side device in the reduced-amplitude bus driving system.

FIG. 12(a) is a circuit diagram illustrating a specific example of a reduced-amplitude bus driving circuit in the reduced-amplitude bus driving system.

FIG. 12(b) is a diagram illustrating an output signal from the reduced-amplitude bus driving circuit illustrated in FIG. 12(a).

FIG. 13(a) is a circuit diagram illustrating another specific example of the reduced-amplitude bus driving circuit in the reduced-amplitude bus driving system.

FIG. 13(b) is a diagram illustrating an output signal from the reduced-amplitude bus driving circuit illustrated in FIG. 13(a).

FIG. 14(a) is a diagram illustrating an output signal from the reduced-amplitude bus driving circuit in the reduced-amplitude bus driving system.

FIG. 14(b) is a diagram illustrating an output signal from a conventional inverter drive circuit.

DESCRIPTION OF THE EMBODIMENTS

The following describes an embodiment of the present invention with reference to FIGS. 1 through 8.

Figure 1:
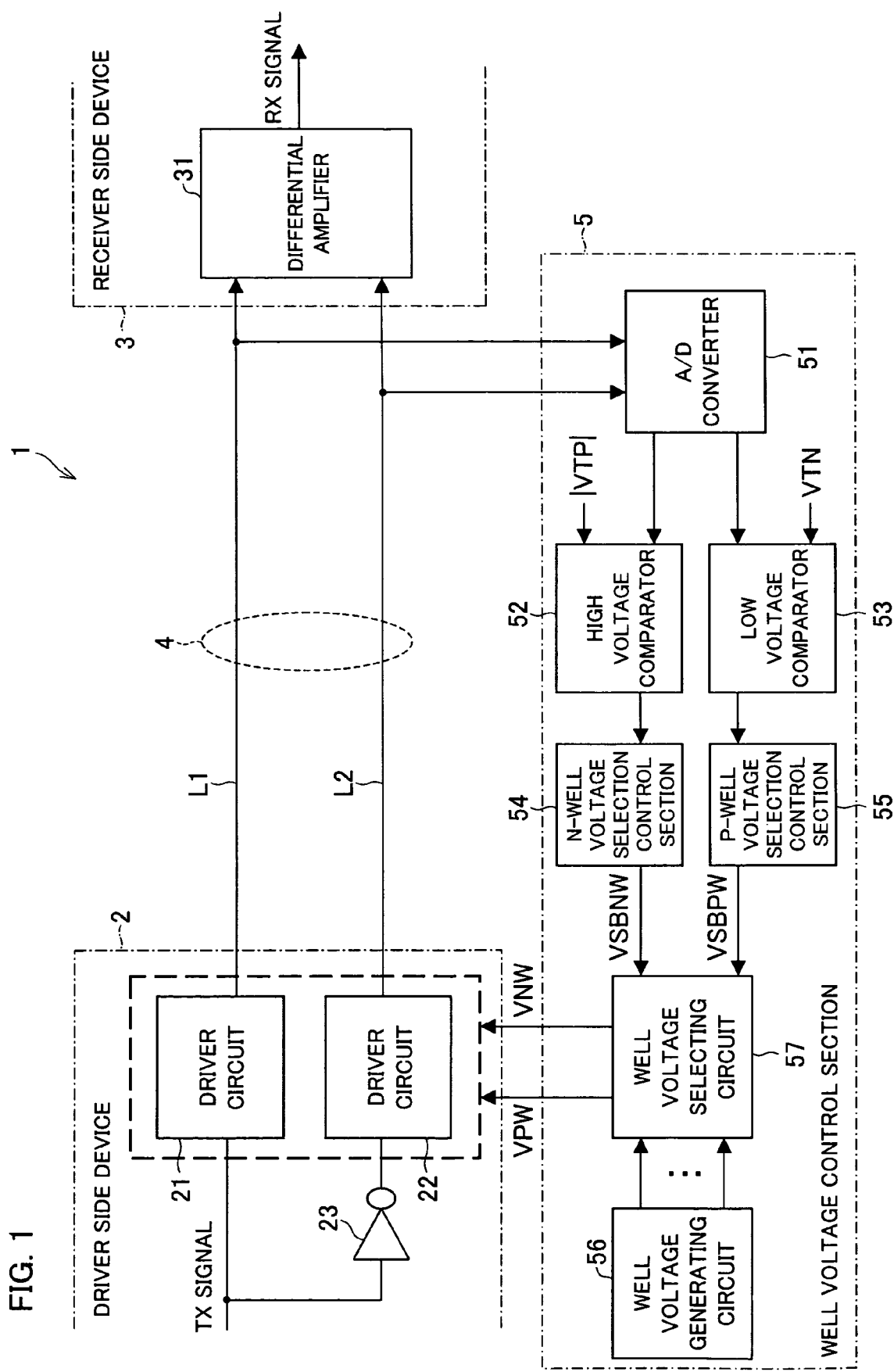
FIG. 1 is a block diagram of an embodiment of the present invention, and illustrates a main part of an LSI.

FIG. 1 illustrates a main part of an LSI (Large Scale Integrated circuit)1 of the present embodiment.

As illustrated in FIG. 1, the LSI 1 which serves as a semiconductor integrated circuit includes a driver-side device 2, a receiver-side device 3, a bus line 4, and a well voltage control section 5.

The driver-side device 2 includes driver circuits 21 and 22, and an inverter 23. The driver circuit 21 reduces amplitudes of TX signals (pre-transmission signals), and the driver circuit 22 reduces amplitudes of the TX signals having been inverted by the inverter 23.

Note that the driver-side device 2 illustrated in FIG. 1 is for the convenience of providing an explanation, and a circuit illustrated in FIG. 12(a) or a circuit illustrated in FIG. 13(a) is actually used as the driver-side device 2. These circuits output, to signal lines L1 and L2, signals whose amplitudes are reduced.

The bus line 4 includes (I) a signal line L1 for transmitting the signal outputted from the driver circuit 21, and (II) a signal line L2 for transmitting the signal outputted from the driver circuit 22.

The receiver-side device 3 has a differential amplifier 31 for generating an RX signal (received signal) in response to the two signals having been transmitted via the signal lines L1 and L2.

Figure 2:
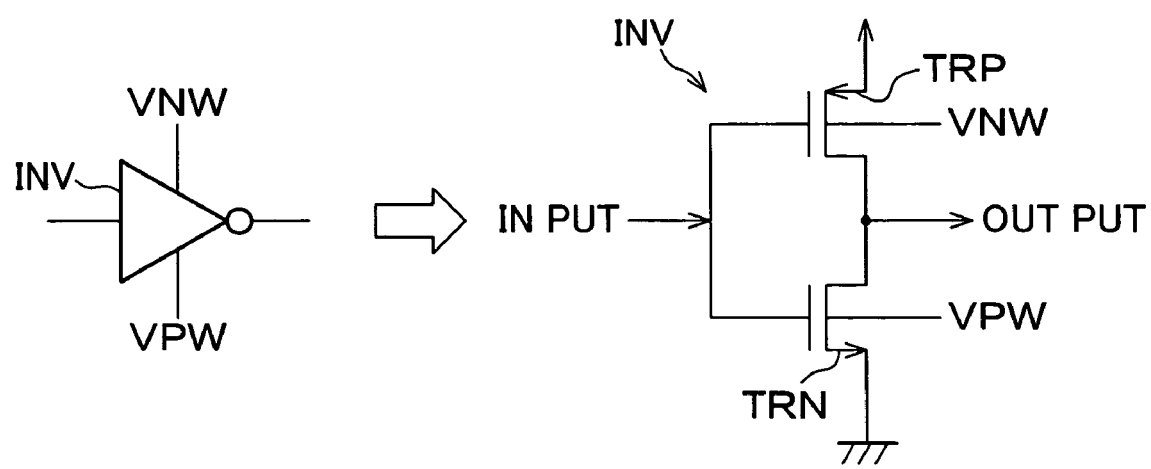
FIG. 2 is a circuit diagram illustrating an example of an inverter for providing an explanation of a separated-well configuration of the present invention.
Figure 3:
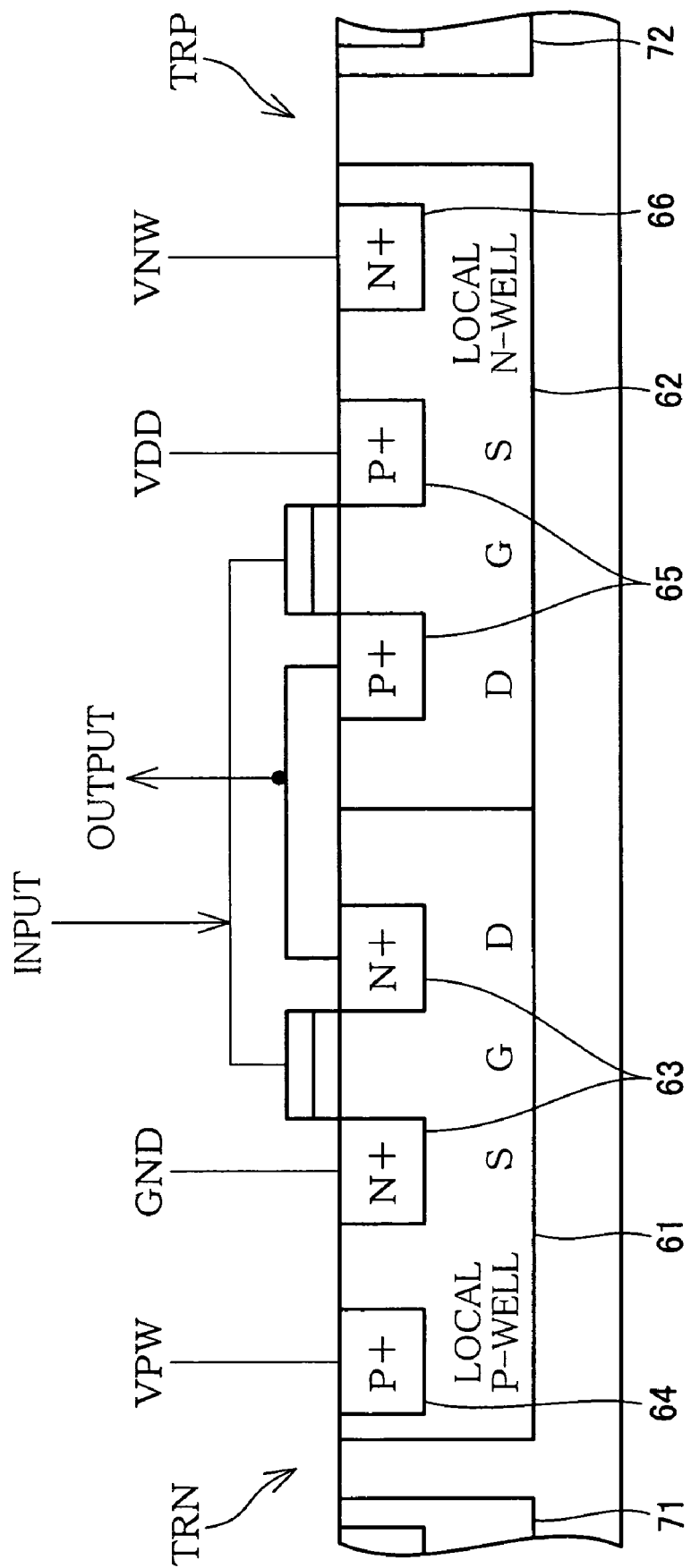
FIG. 3 is a cross sectional view illustrating an example of an inverter for providing an explanation of a separated-well configuration of the present invention.

FIG. 2 and FIG. 3 intend to illustrate a device configuration of a circuit which constitutes the driver circuit 21 and 22, respectively. Note that FIG. 2 and FIG. 3 actually illustrate with an example of an inverter INV for simplicity.

In FIG. 12(a), an actual driver circuit to which the device configuration of the present embodiment is applied includes, for example, nMOS transistor N1 and N3. In FIG. 13(a), an actual driver circuit includes pMOS transistor TP1, TP2, nMOS transistor TN1 and TN2. In other words, when the circuit illustrated in FIG. 12(a) is applied to the driver circuits 21 and 22, the following device configuration is applied to the nMOS transistors N1 and N3. Further, when the circuit illustrated in FIG. 13(a) is applied to the driver circuits 21 and 22, the following device configuration is applied to the pMOS transistors TP1 and TP2, and the nMOS transistors TN1 and TN2.

As illustrated in FIG. 2 and FIG. 3, the inverter INV has a CMOS configuration in which an nMOS transistor TRN and a pMOS transistor TRP are serially connected. The nMOS transistor TRN has a local P-well 61 to which a P-well voltage VPW is applied, and the pMOS transistor TRP has a local N-well 62 to which an N-well voltage VNW is applied.

The P-well 61 of the nMOS transistor TRN and the N-well 62 of the pMOS transistor TRP are integrally formed. However, the local P-well 61 and the local N-well 62 are separated from wells 71 and 72 of other circuits which are formed on a same substrate.

More specifically, two N+ regions 63 which are a source and a drain of the nMOS transistor TRN are formed on the local P-well 61 which is separated from the other circuits. Further, a threshold voltage Vtn is adjusted by the P-well voltage VPW applied to a P+ region 64 formed on the local P-well 61. Similarly, two P+ regions 65 which are a source and a drain of in the pMOS transistor TRP are formed on the local N-well 62 which is separated from the other circuits. Further, a threshold voltage Vtp is adjusted by the N-well voltage VNW applied to an N+ region 66 formed on the local N-well 62. This allows the P-well voltage VPW and the N-well voltage VNW to be applied to the local P-well 61 and the local N-well 62, respectively, independent of other circuits.

The inverter INV is the same as a typical inverter circuit except in that the P-well voltage VPW and the N-well voltage VNW are applied. Namely, a power source voltage VDD is applied to the source of the pMOS transistor TRP, and a ground potential GND is applied to the source of the nMOS transistor TRN. Further, gates of the transistors TRP and TRN are connected, and the drains of the transistors TRP and TRN are connected with each other. An input signal (gate voltage) is provided to the gates of the transistors TRP and TRN, and an output signal (drain voltage) is outputted from the drains of the transistors TRP and TRN.

Figure 4:
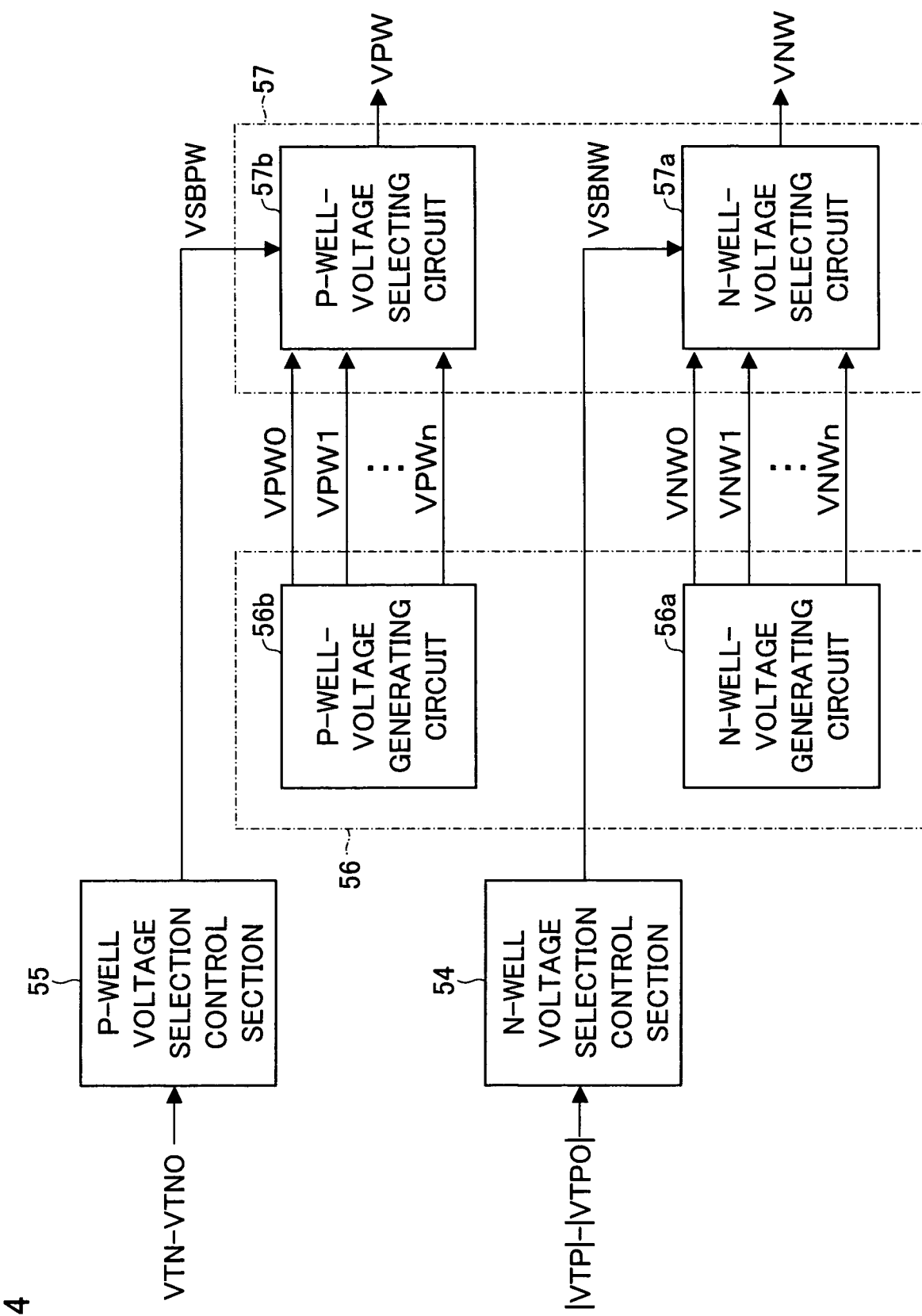
FIG. 4 is a block diagram illustrating a configuration of a main part of a well voltage control section in the LSI.

The following describes in detail the well voltage control section 5, with reference to FIG. 1 and FIG. 4. Here, FIG. 4 illustrates a main part of the well voltage control section 5.

The well voltage control section 5 includes, an A/D converter 51, a High-voltage comparator circuit 52, a Low-voltage comparator circuit 53, an N-well voltage selection control section 54, a P-well voltage selection control section 55, a well voltage generating circuit 56 and a well voltage selecting circuit 57.

The A/D converter 51 converts into digital signals the signals transmitted via the signal lines L1 and L2, respectively, and outputs the digital signals.

The High-voltage comparator 52 compares a target threshold voltage VTP (target value) for the driver circuit 21 with a digital value (measured threshold voltage VTP0) of the signal transmitted via the signal line L1, the digital value being supplied from the A/D converter 51. Then, the High-voltage comparator 52 outputs a difference between the voltage VTP and the measured threshold voltage VTP0. The Low-voltage comparator 53 compares a target threshold voltage VTN (target value) of the driver circuit 22 with a digital value (measured threshold voltage VTN0) of the signal transmitted via the signal line L2, the digital value being supplied from the A/D converter 51. Then, the Low-voltage comparator 53 outputs a difference between the voltage VTN and the measured threshold voltage VTN0.

The N-well voltage selection control section 54 outputs a selecting voltage VSBNW for selecting one of plural N-well voltages VNW, based on the output (|VTP|−|VTP0|) from the High-voltage comparator 52. Here, the N-well voltage VNW is expressed as follows.

$$|VTP|=|VTP0|+\gamma P\{\sqrt{(VNW-VDD+2\Phi FP)}-\sqrt{(2\Phi FP)}\} \quad (1)$$

In the above equation, γP and ΦFP are constants of the pMOS transistor TRP. It is clear that, by transforming the above equation, the N-well voltage VNW varies according to |VTP−VTP0|, as in the following equation.

$$VNW=\{(|VTP|-|VTP0|)/\gamma P+\sqrt{(2\Phi FP)}\}^2-(2\Phi FP)+VDD$$

Accordingly, the N-well voltage selection control section 54 finds the N-well voltage VNW based on the inputted |VTP|−|VTP0|, and outputs a resulting value as the selecting voltage VSBNW (selection control data). The selecting voltage VSBNW is used as the selection control data, in an N-well voltage selecting circuit 57a (see FIG. 4), for selecting one of the inputted plural N-well voltages VNW.

The P-well voltage selection control section 55 outputs a selecting voltage VSBPW for selecting, based on the output (VTN−VTN0) from the Low-voltage comparator 53, one of plural P-well voltages VPW. Here, the P-well voltage VPW is expressed as follows.

$$VTN=VTN0+\gamma N\{\sqrt{(VPW+2\Phi FN)}-\sqrt{(2\Phi FN)}\} \quad (2)$$

In the above equation, γN and ΦFN are constants of the nMOS transistor TRN. It is clear that, by transforming the above equation, the P-well voltage VPW varies according to VTN−VTN0, as in the following equation.

$$VPW=\{(VTN-VTN0)/\gamma N+\sqrt{(2\Phi FN)}\}^2-(2\Phi FN)$$

Accordingly, the P-well voltage selection control section 55 finds the P-well voltage VPW based on the inputted VTN−VTN0, and outputs the resulting value as the selecting voltage VSBPW (selection control data). The selecting voltage VSBPW is used as the selection control data, in an P-well voltage selecting circuit 57b (see FIG. 4), for selecting one of the inputted plural P-well voltages VPW.

The arithmetic processing carried out in the N-well voltage selection control section 54 is executed according to an LUT (Look-Up Table) defining |VTP|−|VTP0| as an input, and the selecting voltage VSBNW as an output. Further, the arithmetic processing carried out in the P-well voltage selection control section 55 is executed according to an LUT (Look-Up Table) defining VTN−VTN0 as an input, and the selecting voltage VSBPW as an output.

Alternatively, the arithmetic processing respectively carried out in the N-well voltage selection control section 54 and the P-well voltage selection control section 55 may be carried out by using a program. In this case, each of the N-well voltage selection control section 54 and the P-well voltage selection control section 55 serves as a functional block which is realized by causing an arithmetic processing section such as a CPU to execute a program stored in a storage device such as ROM (Read Only Memory), RAM or the like. Note that the program may be stored in a removal recording medium.

As illustrated in FIG. 4, the well voltage generating circuit 56 includes an N-well voltage generating circuit 56a and the P-well voltage generating circuit 56b. The N-well voltage generating circuit 56a generates the plurality of the analogue N-well voltages VNW0 to VNWn respectively corresponding with the plurality of the selecting voltages VSBNW outputted from the N-well voltage selection control section 54. Meanwhile, the P-well voltage generating circuit 56b generates a plurality of analogue P-well voltages VPW0 to VPWn respectively corresponding with the plurality of the selecting voltages VSBPW outputted from the P-well voltage selection control section 55. For example, each of the well voltage generating circuit 56a and 56b is realized by a voltage divider including a plurality of resistors for dividing a voltage into a plurality of voltages.

Note that a booster circuit or the like is needed for the well voltage generating circuit 56a and 56b, respectively. This is because it is necessary to (I) apply, to the P+ region 64 in the local P-well 61, a voltage lower than the ground potential GND as well as a voltage higher than the ground potential GND, and (II) apply, to N+ regions 56 in the local N-well 62, a voltage higher than the power source voltage as well as a voltage lower than the power source voltage.

The well voltage selecting circuit 57 includes the N-well voltage selecting circuit 57a and the P-well voltage selecting circuit 57b. The N-well voltage selecting circuit 57a is a circuit having a function of a multiplexer. This N-well voltage selecting circuit 57a selects, in accordance with the selecting voltage VSBNW from the N-well voltage selection control section 54, one of the N-well voltages VNW0 to VNWn generated in the N-well voltage generating circuit 56a. Meanwhile, the P-well voltage selecting circuit 57b, which is also a circuit having a function of a multiplexer, selects, in accordance with the selecting voltage VSBPW from the P-well voltage selection control section 55, one of the P-well voltages VPW0 to VPWn generated in the P-well voltage generating circuit 56b.

Alternatively, it may be possible to use a D/A converter to realize such composite functions of the well voltage generating circuit 56 and the well voltage selecting circuit 57. In this case, instead of providing the well voltage generating circuit 56 and the well voltage selecting circuit 57, a D/A converter is provided for converting, into analogue signals, (I) the selecting voltage VSBNW (i.e., the N-well voltage VNW) generated in the N-well voltage selection control section 54, and (II) the selecting voltage VSBPW (i.e., the P-well voltage VPW) generated in the P-well voltage selection control section 55. However, the D/A converter requires the N-well voltage VNW lower than the ground potential GND, and the P-well voltage VPW higher than the power source voltage. Accordingly, a range of outputted voltage needs to be enlarged, so as to enable outputting of (i) a voltage lower than the ground potential GND or (ii) a voltage higher than the power source voltage.

The following description deals with a well voltage adjusting operation in the LSI 1 having the foregoing configuration.

The A/D converter 51 converts, into digital signals, transmission signals respectively outputted from the driver circuits 21 and 22 to the signal lines L1 and L2 in the bus line 4. In the High-voltage comparator 52, a higher voltage of the digital values from the A/D converter 51, i.e., a High level voltage (measured threshold voltage |VTP0|) is compared with the targeted threshold voltage |VTP|, and then a difference between these voltages is outputted. Further, in the Low-voltage comparator 53, a lower voltage of the digital values from the A/D converter 51, i.e., a Low level voltage (measured threshold voltage VTN0) is compared with the targeted threshold voltage VTN.

In the N-well voltage selection control section 54, the selecting voltage VSBNW is found based on a result obtained from the High-voltage comparator 52. Meanwhile, in the P-well voltage selection control section 55, the selecting voltage VSBPW is found based on a result obtained from the Low-voltage comparator 53.

Further, in the N-well voltage selecting circuit 57a, one of the N-well voltages VNW0 to VNWn generated in the N-well voltage generating circuit 56a is selected in accordance with the selecting voltage VSBNW from the N-well voltage selection control section 54. The selected voltage is applied to the N+ region 66 in the local N-wells 62 of the driver circuits 21 and 22, as the N-well voltage VNW being substantially equal to the N-well voltage (selecting voltage VSBNW) found in the N-well voltage selection control section 54. Meanwhile, in the P-well voltage selecting circuit 57b, one of the P-well voltages VPW0 to VPWn generated in the P-well voltage generating circuit 56b is selected in accordance with the selecting voltage VSBPW from the P-well voltage selection control section 55. The selected voltage is applied to the P+ region 64 in the local P-wells 61 of the driver circuits 21 and 22, as the P-well voltage VPW substantially equal to the P-well voltage (selecting voltage VSBPW) found in the P-well voltage selection control section 55.

In the well voltage adjusting operation, a feed-back system is realized by the bus line 4, the well voltage control section 5, and the driver circuits 21 and 22. Further, in the High-voltage comparator 52 and the Low-voltage comparator 53, such a series of operations for the foregoing well voltage adjustment are repeated until (I) a difference between measured threshold voltage |VTP0| and the target threshold voltage |VTP| becomes 0, and (II) a difference between the measured threshold voltage VTN0 and the target threshold voltage VTN becomes 0. In short, the series of the operations are repeated until the measured threshold values become coincident with the target threshold voltages, respectively. (feed-back control for the well voltage).

Figure 5:
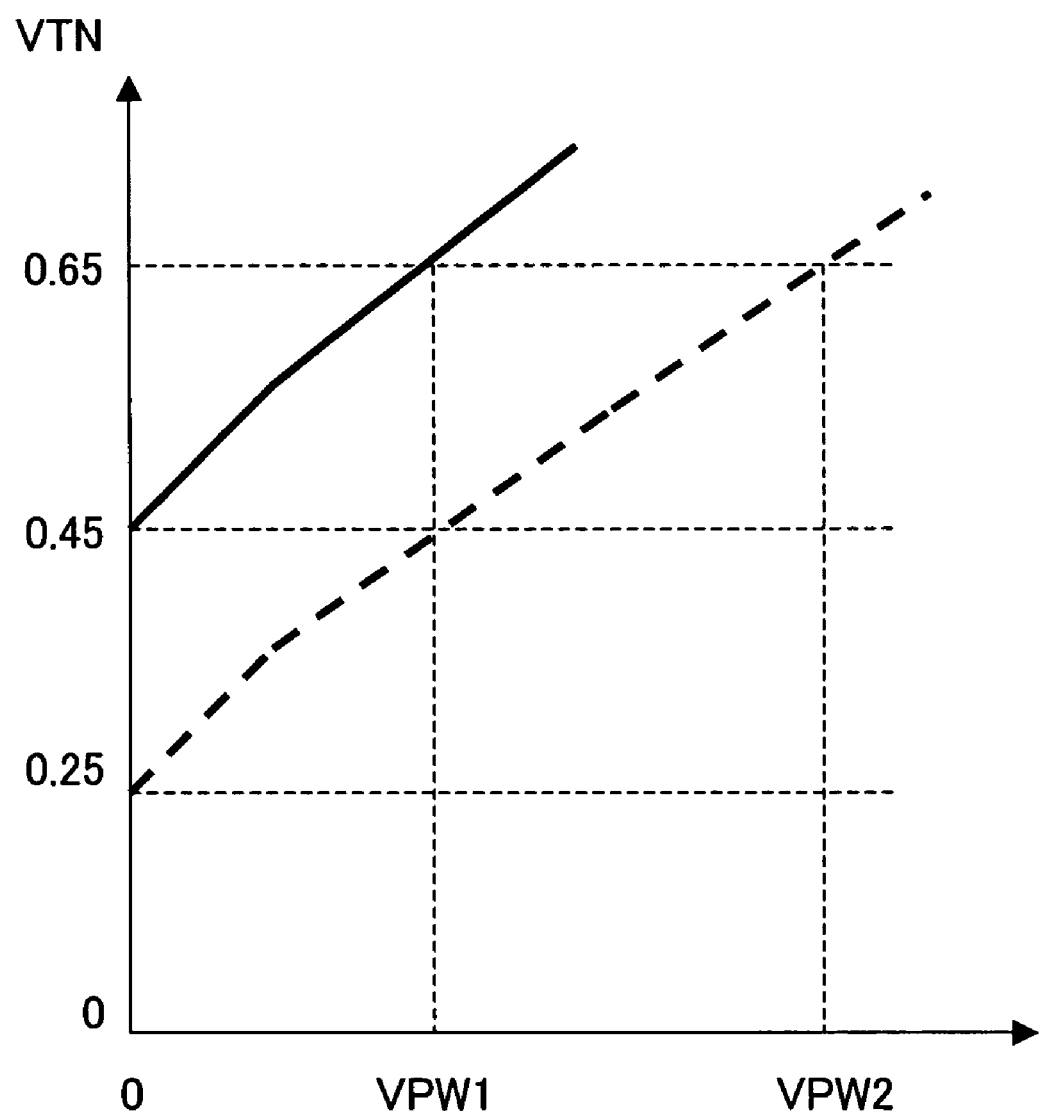
FIG. 5 is a graph indicating an example of a P well voltage adjustment for an nMOS transistor in the driver circuit.

FIG. 5 is a graph of two exemplary well voltage adjustments of the nMOS transistor TRN in the driver circuits 21 and 22. In the graph, the vertical axis represents the threshold voltage VTN, and the horizontal axis represents the P-well voltage VPW. In one of two examples, an example in which the measured threshold voltage VTN0 (threshold voltage Vtn before the adjustment) is 0.45V. In another example, the measured threshold voltage VTN0 is 0.25V. Further, in both of the examples, the target threshold voltage VTN is 0.65V.

The P-well voltage VPW and the target threshold voltage VTN have a relationship expressed as the following equation.

$$VTN = VTN0 + \gamma N\{\sqrt{(VPW + 2\Phi FN)} - \sqrt{(2\Phi FN)}\}$$

Here, γN is a substrate constant.

As indicated by the solid line in FIG. 5, in the example where the measured threshold voltage VTN0 is 0.45V before the well voltage adjustment, the P-well voltage VPW1 is applied to the P+ region 64 of the local P-well 61 so as to cause the threshold voltage Vtn to rise up to the targeted threshold voltage VTN of 0.65V. Further, as indicated by the broken line in FIG. 5, in the case where the measured threshold voltage VTN0 is 0.25V before the well voltage adjustment, the P-well voltage VPW2 is applied to the P+ region 64 so as to cause the threshold voltage Vtn to rise up to the targeted threshold voltage VTN of 0.65V.

Figure 6:
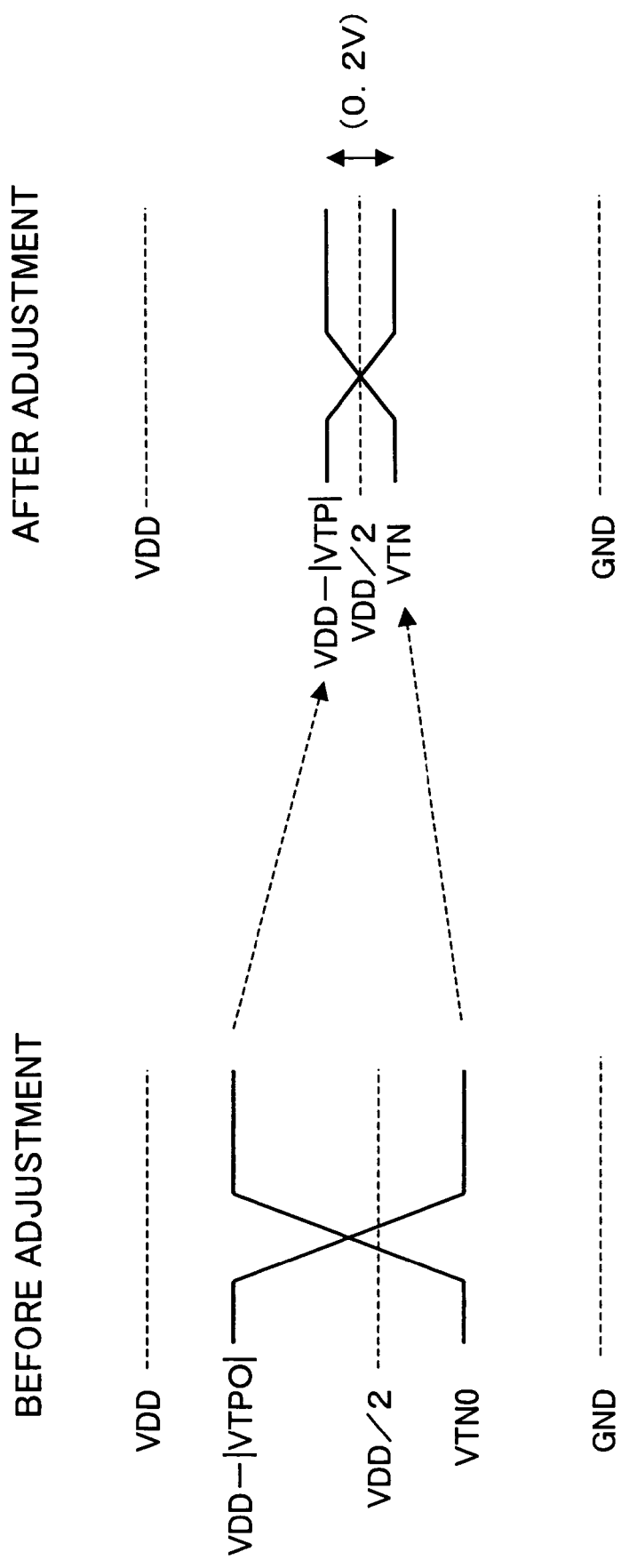
FIG. 6 is a diagram illustrating an effect of automatically adjusting an amplitude of a signal in the bus line of the LSI, by using the well voltage control section.

FIG. 6 illustrates an effect of an automatic adjusting control carried out, by using the well voltage control section 5, with respect to the amplitudes of the signals in the bus line 4.

As illustrated in FIG. 6, before the adjustment of the threshold voltages Vtp and Vtn, the High level of the signal is VDD−|VTP0|, and the Low level of the signal is VTN0. On the contrary, after the adjustment, the High level of the signal drops to VDD−|VTP|, and the Low level of the signal rises up to VTN. Thus, the amplitudes of the signals can be reduced, and the power consumption in the bus line 4 can be reduced. Note that a minimum value of the signal amplitude for ensuring performance of the receiver-side device 3 is set at no less than 0.2V.

Figure 7:
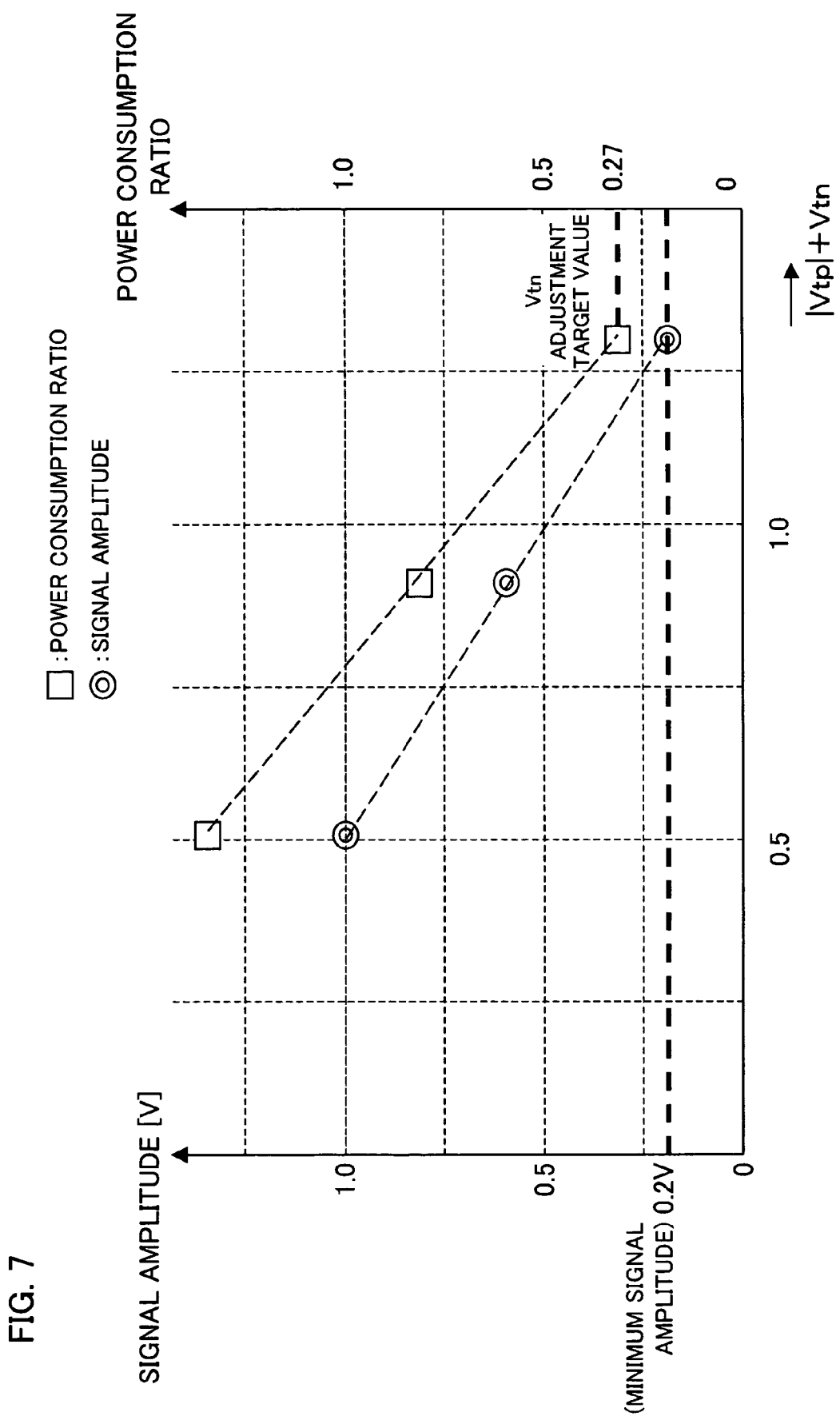
FIG. 7 is a graph indicating exemplary adjustments of a threshold voltage Vth of a transistor in the driver circuit, the adjustment being carried out for optimizing the amplitude of the signal and a power consumption.
Figure 8:
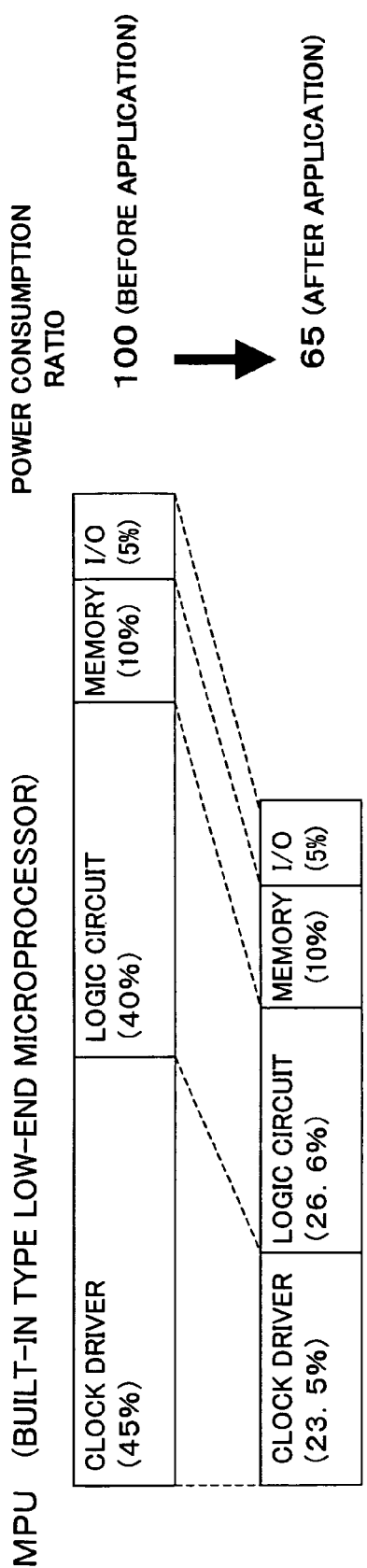
FIG. 8(a) and FIG. 8(b) are diagrams illustrating an effect of reducing the power consumption in a case where a bus driving method of the embodiment is applied to an actual device (MPU or ASSP).
Figure 8:
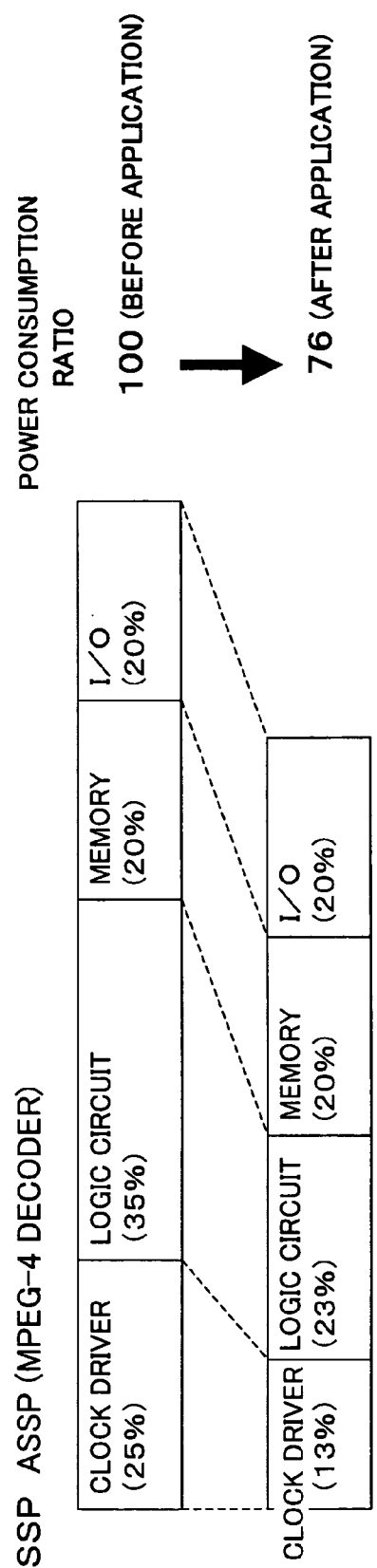
Figure 9:
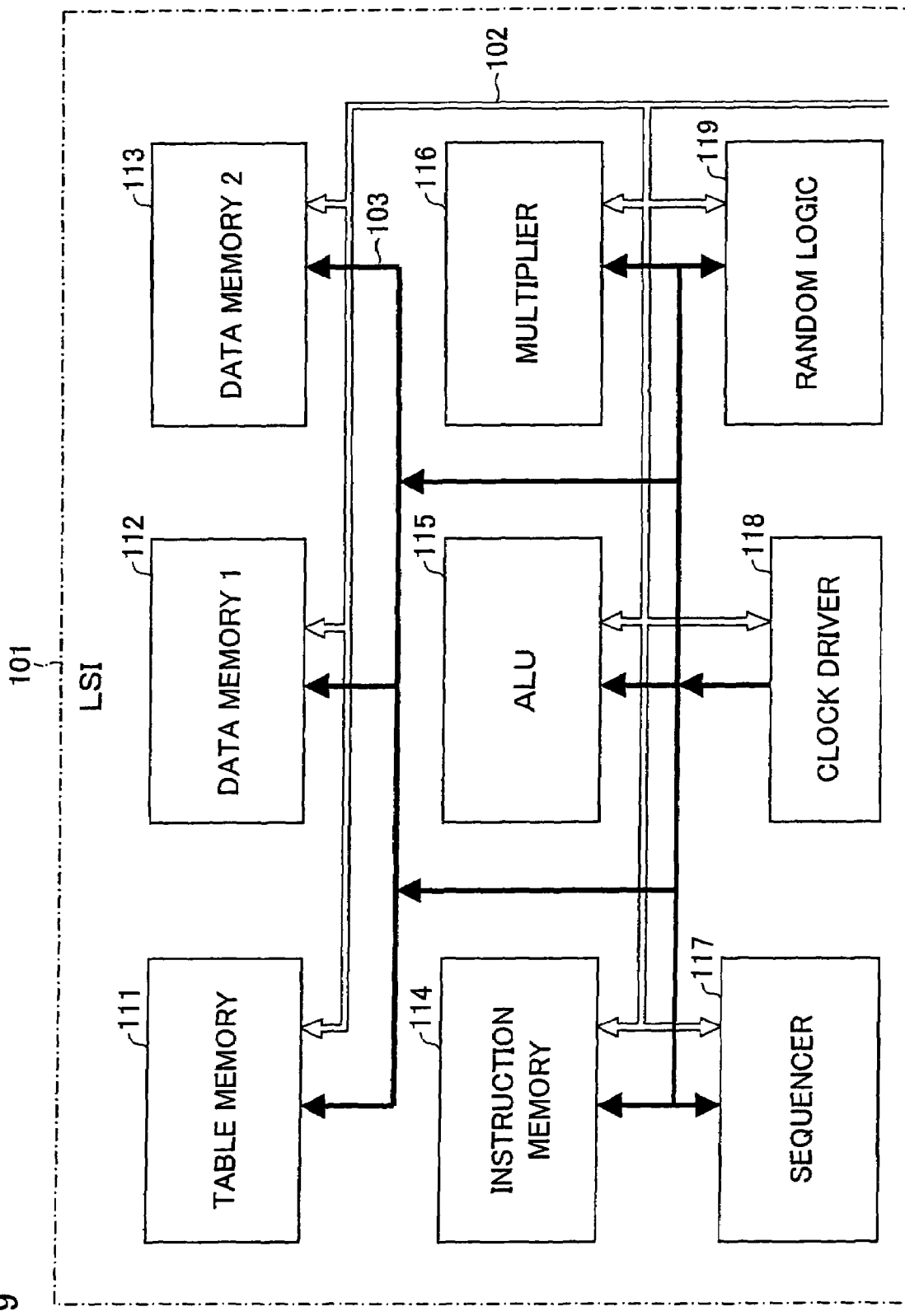
FIG. 9 is a block diagram illustrating a configuration of an LSI having a large capacitance signal line such as an internal bus line or a clock line.
Figure 10:
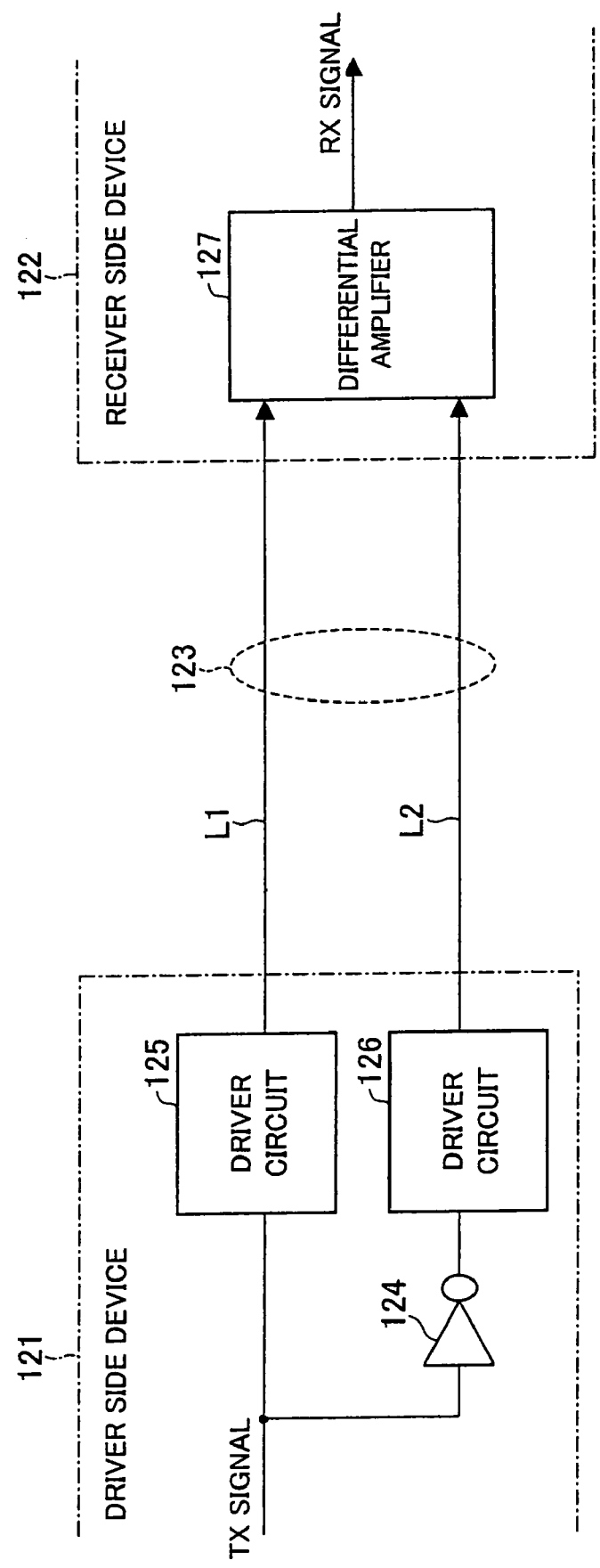
FIG. 10 is a block diagram illustrating a basic configuration of a typical conventional reduced-amplitude bus driving system.
Figure 15:
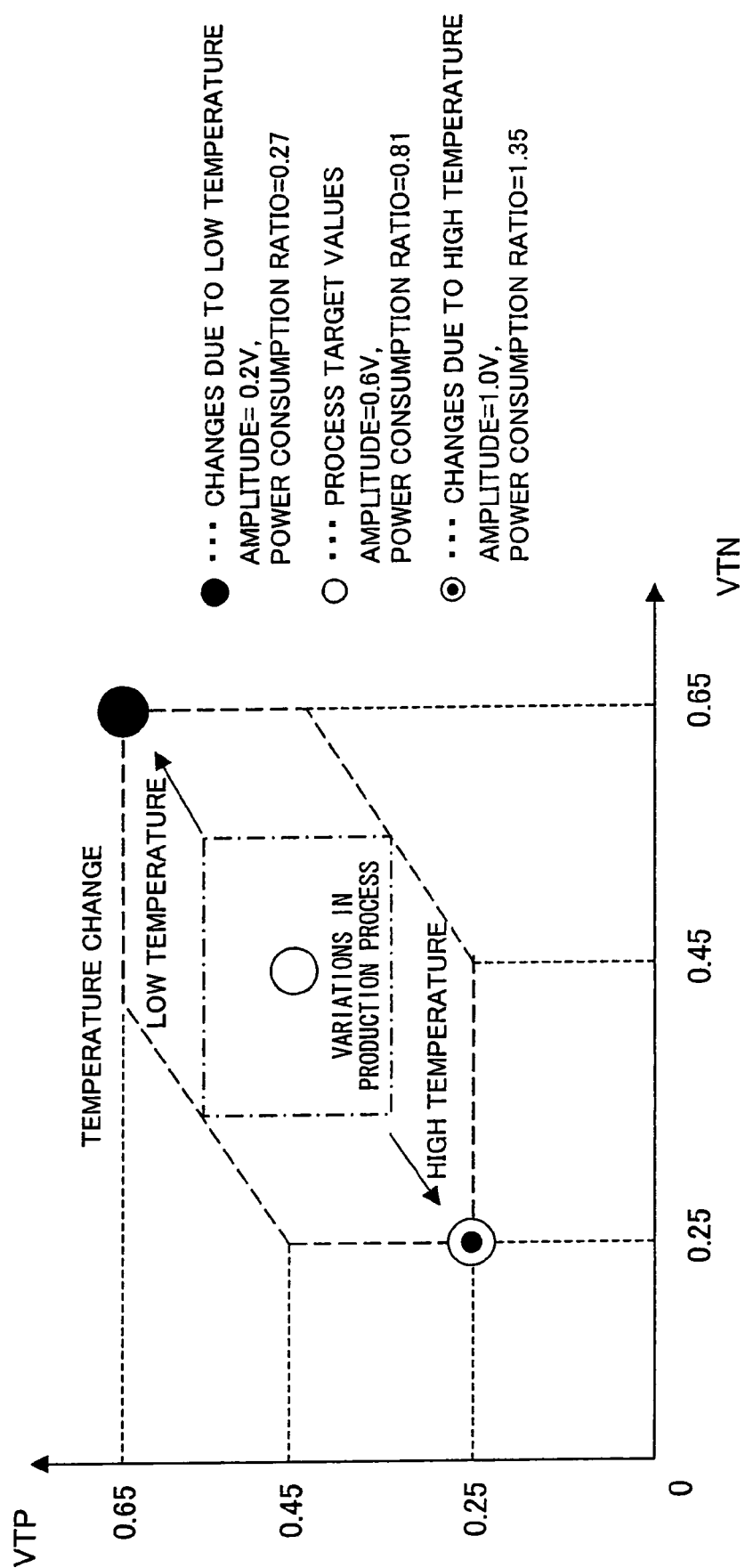
FIG. 15 is a diagram illustrating how a signal amplitude and power consumption are influenced by a change in the threshold voltage Vth in the reduced-amplitude bus driving system, the changes being caused by variations in a production process and temperature changes.

FIG. 7 illustrates a target adjustment value of a threshold voltage Vth for optimizing the signal amplitude and the power consumption.

ratio of the power consumption P is equivalent to 0.33 in the bus driving method of the present embodiment. Further, even with the power consumption value derived from a SPICE simulation, the value resulted in 132 µW in the conventional method, whereas the value resulted in 42 µW in the method of the present embodiment. From these results, it is found that the foregoing calculation is appropriate.

TABLE 1

|  | α | F (Data Frequency) | C | VDD | Vs | n | Pddc | Prdc | P calculated value (Relative Ratio) [SPICE Simulation] |
|---|---|---|---|---|---|---|---|---|---|
| Conventional Method (Inverter Full-Swing Method) | 0.5 | 100 MHz | 1 pF | 1.5 V | 1.5 V | 1 | 10% of Switching Power | 0 | |
|  |  |  | 112.5 µW |  |  |  | 11.2 µW | 0 | 124 µW(1.0) [132 µW] |
| The Present Embodiment | 0.5 | 100 MHz | 1 pF | 1.5 V | 0.2 V | 2 | 0 | 8 µW (Sim value) | |
|  |  |  | 33 µW |  |  |  | 0 | 8 µW | 41 µW(0.33) [42 µW] |

In a case where the minimum signal amplitude needed for ensuring the performance of the receiver-side device 3 is 0.2V, the power consumption is minimized when the signal amplitude is equal to the minimum value of 0.2V. When the power source voltage is 1.5V, a signal amplitude A is expressed based on FIG. 6 as follows.

$$Vs = VDD - |VTP| - VTN$$

Accordingly, by substituting Vs=0.2V and VDD=1.5V to the foregoing equation and assuming that |VTP|=VTN=Vtn=Vtp is satisfied, the threshold voltage Vtn and Vtp are expressed as follows.

$$Vtn = Vtp = (1.5 - 0.2)/2 = 0.65$$

As it is obvious from the foregoing equation, the threshold voltages Vtn and Vtp are both 0.65V, and this value is the target adjusting value. Further, as mentioned before, by raising the threshold voltages Vtn and Vtp upto 0.65V, a power consumption ratio of the bus drive method of the present invention to a conventional inverter drive circuit becomes 0.27, the conventional inverter drive circuit having no measures for reducing the power consumption been taken therein. Thus, the effects of reducing the power consumption is maximized.

Here, the following describes a result obtained from a simulation that compares a power consumption of the bus driving method of the present invention with a conventional inverter full-swing method.

The power consumption P is expressed as follows.

$$P = \alpha \cdot F \cdot C \cdot VDD \cdot Vs \cdot n + Pddc + Prdc$$

In the foregoing equation, a is a data transition probability, F is an operation frequency, C is a capacitance, VDD is a power source voltage, Vs is an amplitude of a signal, n is the number of bus lines, Pddc is a power of the driver through current (short circuit current), and Prdc is a receiver DC power.

As shown in Table 1, the power consumption P figured out from the foregoing equation and FIG. 6 is 124 µW in the conventional method (inverter full-swing method), whereas the power consumption P is small, i.e., 41 µW in the bus driving method of the present invention. When the power consumption P of the conventional method is 1.0, a relative FIG. 8(a) and FIG. 8(b) illustrate effects of reducing the power consumption, in a case where the bus driving method of the present embodiment is applied to an actual device.

FIG. 8(a) illustrates the effect of reducing the power consumption in an MPU (Micro Processing Unit). Note that FIG. 8(a) illustrates an example in which a built-in type low-end microprocessor is used as the MPU. In this example, it is supposed that (i) the bus driving method of the present embodiment is applied to 70% of a clock driver, and to 50% of a logic circuit, and (ii) the power consumption is reduced to approximately 70% of the original power consumption in each of the clock driver and the logic circuit. Further, FIG. 8(b) illustrates the effect of reducing the power consumption in an ASSP (Application Specific Standard Product). Note that FIG. 8(b) illustrates an example in which MPEG-4 decoder is used as the ASSP.

As illustrated in FIG. 8(a), 45% of the power is consumed in the clock driver and 40% is consumed in the logic circuit, before the bus driving method of the present embodiment is applied to the MPU. On the other hand, after-the bus driving method of the present embodiment is applied, 23.5% of the power is consumed in the clock driver, and 26.6% is consumed in the logic circuit. Thus, by applying the bus driving method of the present embodiment, it is possible to reduce the power consumption to 65% as compared to the power consumption of the MPU where the bus driving method is not applied.

Meanwhile, as illustrated in FIG. 8(b), 25% of the power is consumed in the clock driver and 35% is consumed in the logic circuit, before the bus driving method of the present embodiment is applied to the ASSP. On the contrary, after the bus driving method of the present embodiment is applied, 13% of the power is consumed in the clock driver, and 23% is consumed in the logic circuit. Thus, by applying the bus driving method of the present embodiment, it is possible to reduce the power consumption to 76% as compared to the power consumption of the ASSP where the bus driving method is not applied.

As described, the High levels and the Low levels of signals in the bus line 4 are determined by the threshold voltages Vtp and Vtn of the MOS transistors constituting the driver circuits 21 and 22. In other words, the High levels and the Low levels of the signals can be determined by adjusting the threshold voltages Vtp and Vtn. This allows an optimization of the power consumption. In view of the circumstances, the bus driving method of the present embodiment adopts the following configurations (1) and (2) for independently controlling the threshold voltages Vtn and Vtp of the nMOS transistor and the pMOS transistor, respectively:

(1) wells (local P-well 61 and local N-well 62) of the respective driver circuits 21 and 22 are separated from other circuits; and (2) the well voltage control section 5 is provided for controlling, in accordance with the High and Low levels of signals in the bus line 4, (i) the P-well voltage VPW to be applied to the P+ region 64 in the local P-well 61, and (ii) the well voltage VNW to be applied to the N+ region 66 in the local N-well 62 so that the voltages VPW and VNW become equal to the respective target values.

With these configurations, it is possible to control the threshold voltage Vth to be equal to the target value by adjusting the well voltages, even if the threshold voltage Vth varies depending on variation in the production process and/or a change in ambient temperature. Thus, the amplitudes of the signals in the bus line 4 are stably kept constant (function of automatically adjusting amplitude), while avoiding an influence of the change in the threshold voltage Vth. Since the power consumption can be stably reduced, the amplitudes can be kept constant, even if the variation increases in the production process due to a further progress in a deep submicron semiconductor process.

The following sums up the present embodiment.

A bus driving device of the present invention includes: (I) a driver circuit for driving a bus line, the driver circuit including an MOS transistor whose well is separated from other circuits; and (II) a voltage control section for adjusting, in accordance with a level of a signal in the bus line, a value of a well voltage, so that a threshold voltage of the MOS transistor is kept at a predetermined target value.

In the configuration, the well of the MOS transistor constituting the driver circuit is separated from the other circuits. As such, it is possible to set the voltage to be applied to the well, independent of the transistors in the other circuits. Further, the level (High level or Low level) of the signal in the bus line are determined by the voltage to be applied to the well. It is possible to determine the signal levels by adjusting the well voltage. Accordingly, in the bus driving device of the present invention, the voltage control section adjusts the well voltage in accordance with the level of the signal in the bus line. This allows the threshold voltage of the MOS transistor to be set at the target value. Thus, even if the threshold voltage changes due to the variation in a production process or due to a change in ambient temperature, so that the level of the signal in the bus line changes, then the threshold voltage of the MOS transistor is controlled to be equal to the target value by adjusting the well voltage.

The bus driving device is preferably adapted so that the voltage control section includes: (I) a voltage difference finding section for finding a difference between the target value and the threshold voltage of the MOS transistor, based on the level of the signal in the bus line; and (II) a voltage output section for outputting the well voltage so as to compensate the difference found by the voltage difference finding section. In this configuration, first, the voltage difference finding section finds the difference between the actual threshold voltage of the MOS transistor and the target value. Then, the voltage output section outputs the well voltage so that the difference becomes zero. Since the voltage is applied to the well by this feed-back control, it is possible to appropriately control the threshold voltage of the MOS transistor in accordance with the level of the signal in the bus line.

Further, the bus driving device is preferably adapted so that the voltage outputting section includes: (I) a voltage finding section for finding the well voltage based on the difference; and (II) a selection output section for selecting, from a plurality of pre-generated voltages, the well voltage in accordance with the well voltage found by the voltage finding section. The actual threshold voltage of the MOS transistor, the targeted value, and the voltage to be applied to the well have a relationship expressed as the foregoing equations of (1) and (2).

In the configuration, the voltage difference finding section finds the well voltage with the use of the relationship, based on the difference between the threshold voltage and the target value. Usually, this kind of arithmetic processing is digitally carried out. Therefore, the resulting voltage cannot be applied as it is to the well. In view of this, the plurality of voltages are prepared beforehand, and a value found by the voltage finding section is used as data for selecting a voltage to be applied to the well. In accordance with this data, a well voltage is selected from the plurality of voltages. Thus, it is possible to easily realize the feed-back control which is based on the difference between the threshold voltage of the MOS transistor and the target value, when the bus driving device is incorporated to an LSI or the like. Needless to say that it is necessary to prepare beforehand, the plurality of the well voltages, in a case where a voltage which does not fall within a range of a power source voltage is needed.

Further, a semiconductor integrated circuit of the present invention includes a bus driver device having the foregoing configuration. Thus, the semiconductor integrated circuit has the foregoing bus driving device. This allows the semiconductor integrated circuit to stably reduce a power consumption in a bus line.

As described, by providing a bus driver circuit with a function of automatically adjusting an amplitude of signal in the bus line, it is possible to (I) stably maintain constant an amplitude of the signal in the bus line, and (II) realize a stable property of the semiconductor integrated circuit, while avoiding an influence from a change in the Vth caused by the change in the ambient temperature, and/or by the variation in the production process.

As described, in the bus driving device, the well of the MOS transistor constituting the driver circuit is apart from the other circuit, and the value of the voltage to be applied to the well is adjusted in accordance with the level of the signal in the bus line, so that the threshold voltage of the MOS transistor is kept at a predetermined targeted value. With this bus driving device, even if the threshold voltage changes due to the variation in the production process and/or the change in the ambient temperature, it is possible to control the threshold voltage to be equal to the target value by adjusting the well voltage. Since the amplitude of the signal in the bus line is stably kept constant, while avoiding the influence from the changes in the threshold voltage, the power consumption can be stably reduced. As a result, it is possible to stably drive the bus line. Further, the amplitudes can be stably kept constant even if the variation increases in the production process due to a further progress in a deep submicron semiconductor process.

The bus driving device of the present invention allows a stable reduction of a power consumption in a bus line of an LSI or the like, regardless of the variation in a production process or a change in ambient temperature. Thus, the bus driving device of the present invention is applicable to a digital circuit in general such as a processor, DSP, or ASIC including a bus driving circuit.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A bus driving device comprising:
   a driver circuit for driving a bus line, the driver circuit including an MOS transistor whose well is separated from other circuits; and
   a voltage control section for adjusting, in accordance with a level of a signal in the bus line, a value of a well voltage, so that a threshold voltage of the MOS transistor is kept at a predetermined target value, wherein
   the voltage control section includes:
      a voltage difference finding section for finding a difference between the target value and the threshold voltage of the MOS transistor, based on the level of the signal in the bus line; and
      a voltage output section for outputting the well voltage so as to compensate the difference found by the voltage difference finding section, and the voltage output section includes:
      a selecting voltage finding section for finding a selecting voltage based on the difference; and
      a selection output section for selecting, from a plurality of pre-generated voltages, the well voltage in accordance with the selecting voltage found by the selecting voltage finding section.

2. The bus driving device as set forth in claim 1, wherein the voltage finding section finds the well voltage, upon an input of the difference, by referring to a look up table which specifies the difference and a corresponding well voltage.

3. A bus driving device comprising:
   a driver circuit for driving a bus line, the driver circuit including an MOS transistor whose well is separated from other circuits; and
   a voltage control section for adjusting, in accordance with a level of a signal in the bus line, a value of a well voltage, so that a threshold voltage of the MOS transistor is kept at a predetermined target value, wherein
   the voltage control section includes:
      a voltage difference finding section for finding a difference between the target value and the threshold voltage of the MOS transistor, based on the level of the signal in the bus line; and
      a voltage output section for outputting the well voltage so as to compensate the difference found by the voltage difference finding section, and
   the voltage output section includes:
      a voltage generating section for generating a plurality of voltages;
      a selection output section for (i) selecting, from the plurality of voltages, the well voltage in accordance with selection control data, and (ii) outputting the voltage; and
      a data calculating section for calculating the selection control data based on the difference.

4. A semiconductor integrated circuit comprising:
   a bus line; and
   a bus driving device having
      (a) a driver circuit for driving the bus line, the driver circuit including an MOS transistor whose well is separated from other circuits; and
      (b) a voltage control section for adjusting, in accordance with a level of a signal in the bus line, a value of a well voltage, so that a threshold voltage of the MOS transistor is kept at a predetermined target value, wherein
   the voltage control section includes:
      a voltage difference finding section for finding a difference between the target value and the threshold voltage of the MOS transistor, obtained on a basis of the level of the signal in the bus line; and
      a voltage output section for outputting the well voltage so as to compensate the difference found by the voltage difference finding section, and
   the voltage output section includes:
      a selecting voltage finding section for finding a selecting voltage based on the difference; and
      a selection output section for selecting, from a plurality of pre-generated voltages, the well voltage in accordance with the selecting voltage found by the selecting voltage finding section.

5. The semiconductor integrated circuit as set forth in claim 4, wherein
   the voltage finding section finds the well voltage, upon an input of the difference, by referring to a look up table which specifies the difference and a corresponding well voltage.

6. A semiconductor integrated circuit comprising:
   a bus line; and
   a bus driving device having
      (a) a driver circuit for driving the bus line, the driver circuit including an MOS transistor whose well is separated from other circuits; and
      (b) a voltage control section for adjusting, in accordance with a level of a signal in the bus line, a value of a well voltage, so that a threshold voltage of the MOS transistor is kept at a predetermined target value, wherein
   the voltage control section includes:
      a voltage difference finding section for finding a difference between the target value and the threshold voltage of the MOS transistor, obtained on a basis of the level of the signal in the bus line; and
      a voltage output section for outputting the well voltage so as to compensate the difference found by the voltage difference finding section, and
   the voltage output section includes:
      a voltage generating section for generating a plurality of voltages;
      a selection output section for (i) selecting, from the plurality of voltages, the well voltage in accordance with selection control data, and (ii) outputting the voltage; and
      a data calculating section for calculating the selection control data based on the difference.

7. The semiconductor integrated circuit as set forth in claim 6, further comprising:
   a driver side device having the driver circuit for reducing an amplitude of a pre-transmission signal; and
   a receiver side device for receiving, via the bus line, the pre-transmission signal from the driver side device.

* * * * *